United States Patent
Brown et al.

(10) Patent No.: US 7,183,123 B1
(45) Date of Patent: Feb. 27, 2007

(54) METHOD OF SURFACE PREPARATION AND IMAGING FOR INTEGRATED CIRCUITS

(75) Inventors: Terrence Harold Brown, Harwood, MD (US); Larry Gene Ferguson, Baltimore, MD (US)

(73) Assignee: The United States of America as represented by the National Security Agency, Washington, DC (US)

(*) Notice: Subject to any disclaimer, the term of this patent is extended or adjusted under 35 U.S.C. 154(b) by 264 days.

(21) Appl. No.: 10/943,826

(22) Filed: Sep. 13, 2004

(51) Int. Cl.
*H01L 21/66* (2006.01)
(52) U.S. Cl. ............................ 438/14; 438/16; 438/459
(58) Field of Classification Search ................ 438/14, 438/15, 17, 455, 456, 459, 16
See application file for complete search history.

(56) References Cited

U.S. PATENT DOCUMENTS

| | | | |
|---|---|---|---|
| 6,107,107 A | 8/2000 | Bruce et al. | |
| 6,168,965 B1 | 1/2001 | Malinovich et al. | |
| 6,225,626 B1* | 5/2001 | Talbot et al. | 250/307 |
| 6,329,212 B1* | 12/2001 | Dobrovolski | 438/15 |
| 6,338,974 B1 | 1/2002 | Strnad | |
| 6,921,719 B2* | 7/2005 | Paterson et al. | 438/704 |

* cited by examiner

*Primary Examiner*—Tuan H. Nguyen
(74) *Attorney, Agent, or Firm*—Jennifer P. Ferragut

(57) ABSTRACT

The present invention is a method of surface preparation and imaging for integrated circuits. First, a substrate is selected and an opening is cut in the substrate of a sufficient size to fit an integrated circuit to be analyzed. A second substrate is then selected. An adhesive film is applied to the top surface of the first substrate, the adhesive film having adhesive on both sides and covering the opening on the first substrate. An integrated circuit is then inserted into the opening and attached to the bottom side of the adhesive film. Next, the first substrate and integrated circuit are bonded to the second substrate using the adhesive film. The bottom side of the first substrate and the integrated circuit are then thinned until the substrate wafer of the integrated circuit is completely removed. Finally, an analytical imaging technique is performed on the integrated circuit from the bottom side of the first substrate.

17 Claims, 3 Drawing Sheets

METHOD OF SURFACE PREPARATION AND IMAGING FOR INTEGRATED CIRCUITS

FIELD OF INVENTION

This invention relates to a semiconductor device manufacturing process and, more specifically, to a semiconductor device manufacturing process with measuring of electrical characteristics of the semiconductor.

BACKGROUND OF THE INVENTION

Integrated circuit analysis imaging techniques are frequently used during failure analysis of semiconductor devices. Methods for performing this analysis include collection and analysis of emitted radiation, electron microscopy, and conventional optical imaging. The image derived from the analysis method chosen can be examined to determine several characteristics of the invention, including operational and failure modes of a typical integrated circuit. Though early imaging systems examined only the front surface of the integrated circuit, in recent years it has become common to image the integrated circuit from the backside after performing processing of the backside of the integrated circuit.

Backside imaging allows enhanced viewing of the interconnects, which generally reside on the substrate at the lowest level of the chip. Because the interconnects are a frequent source of failure in an integrated circuit, the ability to clearly view the interconnects greatly reduces the number of defective parts distributed by a manufacturer. It also allows simpler and more accurate failure analysis during the testing phases of product development. Additionally, backside processing provides a clearer view of the components of the integrated circuit as the interconnects do not obscure the view of the electronic components as severely as the components obscure the view of the interconnects in frontside imaging. This again results in more accurate failure and operational analysis.

U.S. Pat. No. 6,107,107, entitled "ANALYZING AN ELECTRONIC CIRCUIT FORMED UPON A FRONTSIDE SURFACE OF A SEMICONDUCTOR SUBSTRATE BY DETECTING RADITATION EXITING A BACKSIDE SURFACE COATED WIH AN ANTIREFLECTIVE MATERIAL," discloses an imaging system that detects electromagnetic radiation emanating from the backside surface of an integrated circuit. The backside surface is coated with an antireflective coating, a beam of electromagnetic radiation is directed to the backside surface or electrical power is supplied to the circuit, and the radiation emanated from the backside is collected. The emitted radiation is used to analyze the circuit. This method of analysis is not used in the present invention. U.S. Pat. No. 6,107,107 is hereby incorporated by reference into the specification of the present invention.

U.S. Pat. No. 6,168,965, entitled "METHOD FOR MAKING BACKSIDE ILLUMINATED IMAGE SENSOR," discloses an imaging system that views the backside of an integrated circuit. With this method, the frontside of the circuit is attached to a support substrate and the backside of the circuit is subjected to processing until the semiconductor substrate is removed. A transparent substrate is then attached to the backside of the circuit and an imaging process is performed. The present invention does not operate in this manner. U.S. Pat. No. 6,168,965 is hereby incorporated by reference into the specification of the present invention.

U.S. Pat. No. 6,338,974, entitled "INTEGRATED CIRCUIT ANALYTICAL IMAGING TECHNIQUE EMPLOYING A BACKSIDE SURFACE FILL LAYER," discloses a method of processing a backside of an integrated circuit to allow analysis of the circuit. With this method, the backside of the circuit is thinned, resulting in a thin semiconductor substrate having peaks and valleys. A fill material is applied to the thin substrate to at least partially fill the valleys. The result is a smother substrate surface. This surface is imaged using any conventional radiation emission imaging technique. The present invention does not use this method for backside imaging. U.S. Pat. No. 6,338,974 is hereby incorporated by reference into the specification of the present invention.

The difficulty in performing failure or operational analysis on an integrated circuit is obtaining a clear view of the components of the circuit. To achieve this, most modern systems attempt to obtain a sufficiently thin and smooth backside surface to allow a clear image to be acquired of the circuit components. This structure is often attained by the addition of structures such as fill materials, transparent substrates, or antireflective coatings. This adds both cost and complexity to an already complex process. Further, these additional components may interfere with the image obtained if they are not applied with absolute precision. The substances may also create undesirable reflections or shadows, thereby distorting the final image. Moreover, the additional elements generally limit the techniques that can be used to image the integrated circuit. It is therefore desirable in the art to have a simple, cost-effective backside imaging process that allows a clear image to be obtained of the components of an integrated circuit by a variety of imaging methods.

SUMMARY OF THE INVENTION

It is an object of the present invention to provide a semiconductor analysis technique that allows a clear image of the components of an integrated circuit to be obtained.

It is a further object of the present invention to provide a semiconductor analysis technique that allows a clear image of the components of an integrated circuit to be obtained without the addition of elements to the backside of the processed integrated circuit.

It is a further object of the present invention to provide a semiconductor analysis technique that allows a clear image of the components of an integrated circuit to be obtained without the addition of elements to the backside of the processed integrated circuit and that allows analysis by multiple conventional imaging techniques.

The present invention is a method of surface preparation and imaging of integrated circuits. The first step of the method is selecting a first substrate.

The second step of the method is cutting an opening in the first substrate. The opening matches the size of an integrated circuit to be analyzed according to the method. The integrated circuit includes a substrate wafer, at least one interconnect, and at least one electronic device.

The third step of the method is selecting a second substrate.

The fourth step of the method is applying an adhesive film to the first substrate. The adhesive film covers the opening in the first substrate and has adhesive on both sides.

The fifth step of the method is inserting the integrated circuit into the opening in the first substrate.

The sixth step of the method is attaching the integrated circuit to the bottom side of the adhesive film.

The seventh step of the method is bonding the first substrate and the integrated circuit to the second substrate. The bonding is achieve by sandwiching the adhesive film between the first substrate and integrated circuit and the second substrate.

The eighth step of the method is thinning the bottom side of the first substrate and the integrated circuit such that the substrate wafer of the integrated circuit is removed.

The ninth step of the method is performing an analytical imaging technique on the integrated circuit.

DETAILED DESCRIPTION OF THE PREFERRED EMBODIMENTS

Figure 1:
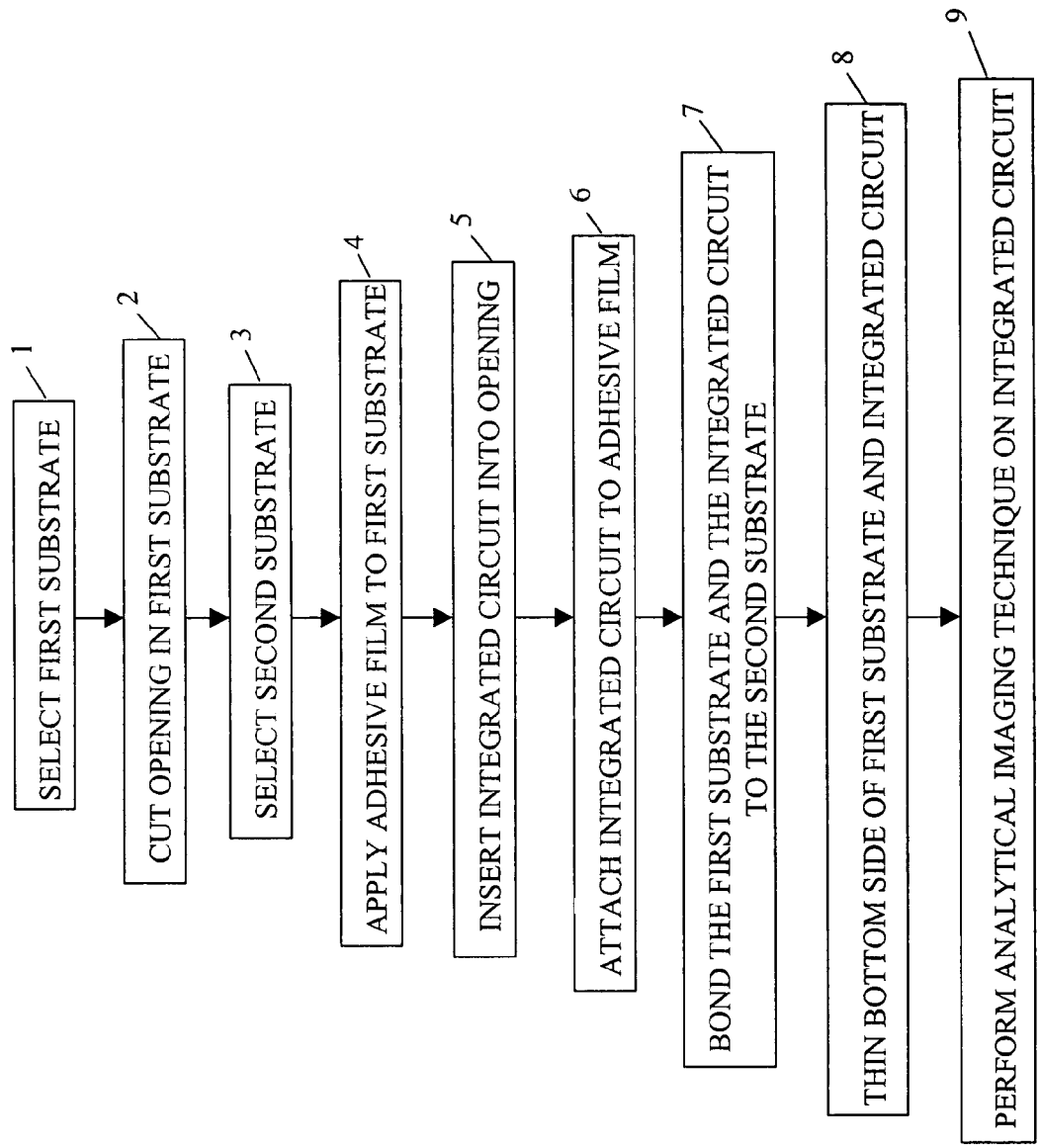
FIG. 1 is a flow chart of the steps of the present invention.

The present invention is a method of surface preparation and imaging of integrated circuits. FIG. 1 is a list of the steps of the present invention. The first step 1 is selecting a first substrate. The first substrate is composed of a suitable rigid material, many of which are well known and commonly used in the art, but is preferably a silicon wafer. As would be obvious to one of skill in the art, any other suitable substrate material could be used, such as such as quartz, polysilicon, silicon-on-insulator, or gallium arsenide. In a preferred embodiment the substrate is composed of silicon and has a diameter of approximately 152 mm.

The second step 2 of the method is cutting an opening in the first substrate. The opening matches the size of an integrated circuit to be analyzed according to the method. As is well known to those skilled in the art, integrated circuits typically include a substrate wafer, such as a silicon substrate, upon which the components of the integrated circuit are mounted, grown, or etched. Electronic components included on the substrate wafers are generally connected by metal structures commonly known to those skilled in the art as interconnects. In the preferred embodiment, the integrated circuit includes a substrate wafer, at least one interconnect, and at least one electronic device. The opening in the first substrate dimensioned to fit the integrated circuit. In the preferred embodiment, the outer dimensions of the integrated circuit will match the inner dimensions of the opening such that there will be a close fit between the two if the integrated circuit is housed in the opening. The substrate wafer and the first substrate are preferably composed of the same material.

The third step 3 of the method is selecting a second substrate. The second substrate is preferably constructed of the same material as the first substrate and the substrate wafer of the integrated circuit, and further has approximately the same dimensions as the first substrate prior to the cutting of the opening in the second step 2 of the method. As with the first substrate, the second substrate may be composed of any other suitable rigid material, many of which are well known and commonly used in the art, such as such as quartz, polysilicon, silicon-on-insulator, or gallium arsenide. The second substrate preferably has a diameter of approximately 152 mm and a thickness of approximately 500 um.

The fourth step 4 of the method is applying an adhesive film to the first substrate. The adhesive film is preferably a double sided adhesive film applied to the top side of the first substrate. In the preferred embodiment the adhesive film covers the entire surface of the top side of the first substrate, however in all embodiments the adhesive film must cover the opening in the first substrate. The adhesive film is preferably a commercially available double-sided tape, such as acrylic glue, but may be any suitable adhesive film, many of which are well-known and commonly used in the art. Additionally, an adhesive may be applied to the entire bottom surface of the second substrate. This obviates the need of covering the hole in the first substrate as all elements would contact the bottom surface of the second substrate during fabrication, as will become obvious with reference to the description below.

The fifth step 5 of the method is inserting an integrated circuit into the opening in the first substrate. The integrated circuit is inserted into the opening of the first substrate such that the substrate wafer of the integrated circuit is in contact with the bottom side of the first substrate. Correspondingly, when viewing the top side of the first substrate the electronic components of the integrated circuit will be visible through the opening after insertion of the integrated circuit into the opening. In the preferred embodiment, the integrated circuit is aligned with the bottom side of the first substrate such that the substrate wafer and the bottom side of the first substrate form a smooth surface. The height of the integrated circuit is preferably equal to the thickness of the first substrate, such that after insertion the top of the integrated circuit will be even with the top side of the first substrate and the bottom of the integrated circuit will form a smooth surface with the bottom side of the first substrate. Because the top of the integrated circuit includes a number of distinct electronic components, a smooth surface will not be formed along the top side of the first substrate, though the top of the integrated circuit and the top side of the first substrate preferably lie in the same horizontal plane.

The sixth step 6 of the method is attaching the integrated circuit to the bottom side of the adhesive film. As was explained in detail earlier, an adhesive film is preferably attached to the top side of the first substrate. After inserting the integrated circuit into the opening in the first substrate, the integrated circuit is attached to the adhesive film. The method of attachment will depend on the type of adhesive used, as would be obvious to one of skill in the art. In the preferred embodiment, the integrated circuit is attached to the adhesive film by applying pressure to the bottom side of the first substrate and substrate wafer in the direction of the adhesive film and to the top side of the adhesive film in the direction of the integrated circuit. Heat may additionally be applied, depending on the adhesive used. If adhesive is placed on the bottom side of the second substrate, as opposed to the top side of the first substrate, this step is omitted.

The seventh step 7 of the method is bonding the first substrate and integrated circuit to the second substrate. The first substrate, second substrate and adhesive film are bonded via the adhesive film applied to the first substrate in the fourth step 4 of the method. To bond the two substrates and the integrated circuit, the second substrate is preferably brought into contact with the adhesive film and pressure is placed on the first substrate, the second substrate and the integrated circuit, until the substrates are attached. The attachment method will be discussed in greater detail with reference to FIG. 2. If an adhesive is placed on the bottom side of the second substrate, as opposed to using an adhesive film, the method of bonding will vary with the adhesive used. For example, if the bottom side of the second substrate is coated with a glue, the top side of the first substrate and the top side of the integrated circuit may be pressed against the bottom side of the second substrate until the components are bonded. Many methods of bonding components are well known to those of skill in the art, and any method could be used in place of the preferred method that would allow the integrated circuit to be closely fit within the opening in the first substrate and further allow both the first substrate and integrated circuit to be firmly attached to the second substrate.

Figure 2:
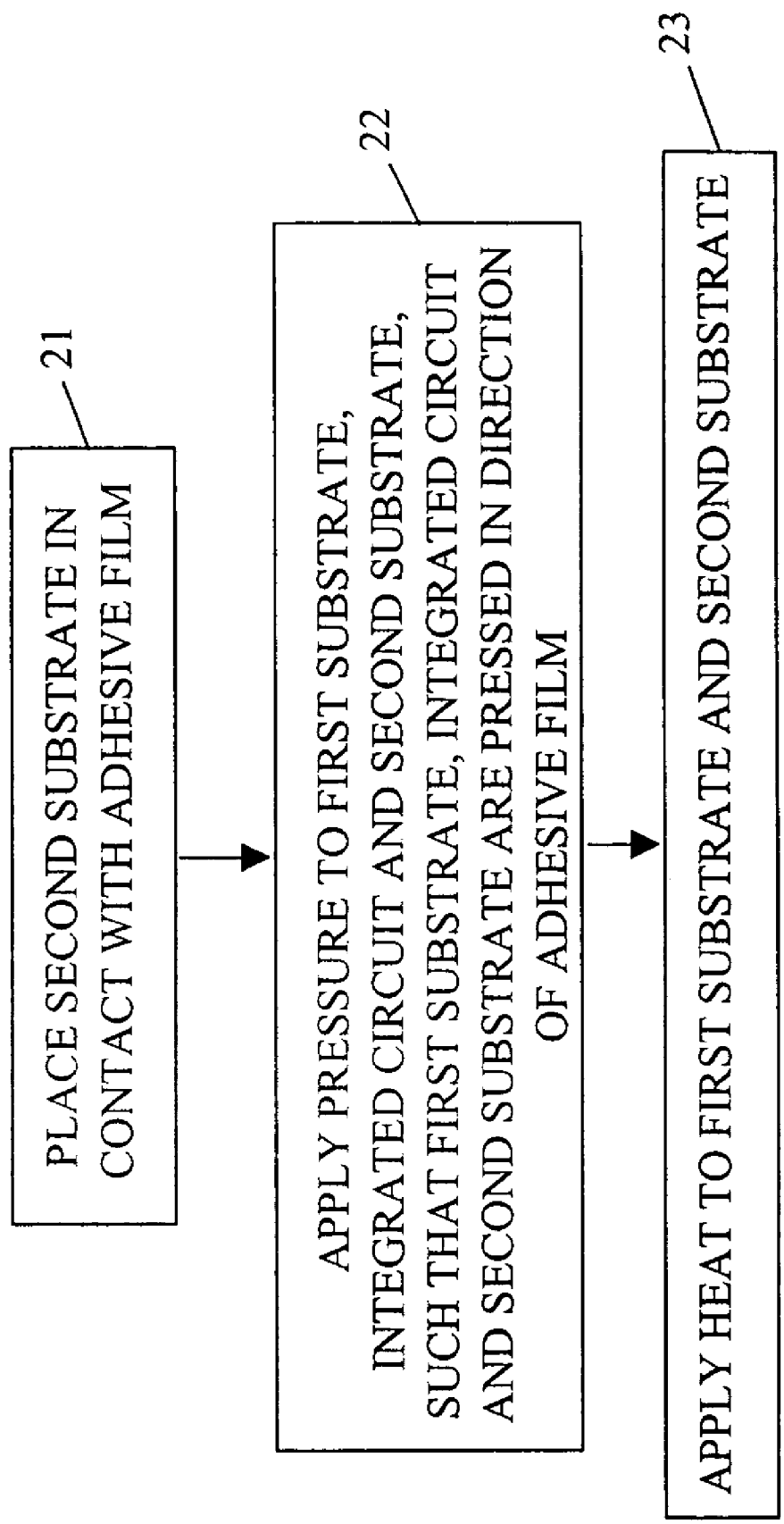
FIG. 2 is a flow chart detailing the steps of the seventh step of FIG. 1.

FIG. 2 is a list of steps to bond the first substrate and integrated circuit to the second substrate according to the seventh step 7 of the method of FIG. 1. The first step 21 of the bonding method is placing the second substrate in contact with top side of the adhesive film. As was explained in greater detail earlier, the adhesive film is applied to the top side of the first substrate and includes adhesive on both sides. In the first step of the method, the bottom side of the second substrate is brought into contact with the top side of the adhesive film such that the bottom side lies flat along the entire surface of the top side of the adhesive film.

The second step 22 of the bonding method is applying pressure to the first substrate the second substrate and the integrated circuit such that the first substrate, the second substrate and the integrated circuit are pressed in the direction of the adhesive film. As was explained in greater detail above, the adhesive film includes adhesive on both its top side and its bottom side. The top side of the first substrate and the integrated circuit are in contact with the bottom side of the adhesive film. The bottom side of the second substrate is in contact with the top side of the adhesive film. In the construction described above, the adhesive film is sandwiched between the first substrate and integrated circuit and the second substrate. The elements are initially bonded together by applying pressure from the outside of these elements inward such that the adhesive on the top side and bottom side of the adhesive film bonds to the corresponding surfaces of the first substrate, integrated circuit and second substrate.

The third step 23 of the bonding method is applying heat to the first substrate and the second substrate. In the preferred embodiment heat is applied to the first substrate and the second substrate to complete bonding of the first substrate and the second substrate. As is well known to those skilled in the art, heat is commonly used to cure a variety of adhesives. This step may be omitted depending on the adhesive used, according to user preferences. Heat is preferably not applied to the integrated circuit, as this may cause damage to the circuit and may create unwanted effects in the circuit. However, heat may be applied to the integrated circuit as well, according to user preferences.

The eighth step 8 of the method of FIG. 1 is thinning the bottom side of the first substrate and the integrated circuit such that the substrate wafer of the integrated circuit is removed. Thinning the bottom side of the first substrate and the substrate wafer can be accomplished by a variety of methods, including grinding, lapping, and wet and dry etching. The bottom side of the first substrate and the substrate wafer are thinned until the substrate wafer is entirely removed. This will expose the interconnects and electronic components of the integrated circuit. Because the integrated circuit is bonded to the adhesive film and housed within the opening in the first substrate, the components will not disassemble, despite the fact that they are no longer attached to the substrate wafer. This allows accurate operational or failure analysis to be conducted on the integrated circuit after removal of the substrate wafer without the need of an additional support substrate. Further, as will become more obvious with reference to the description below, analysis is aided by the fact that the components of the device can be viewed directly from the bottom side of the first substrate.

Figure 3:
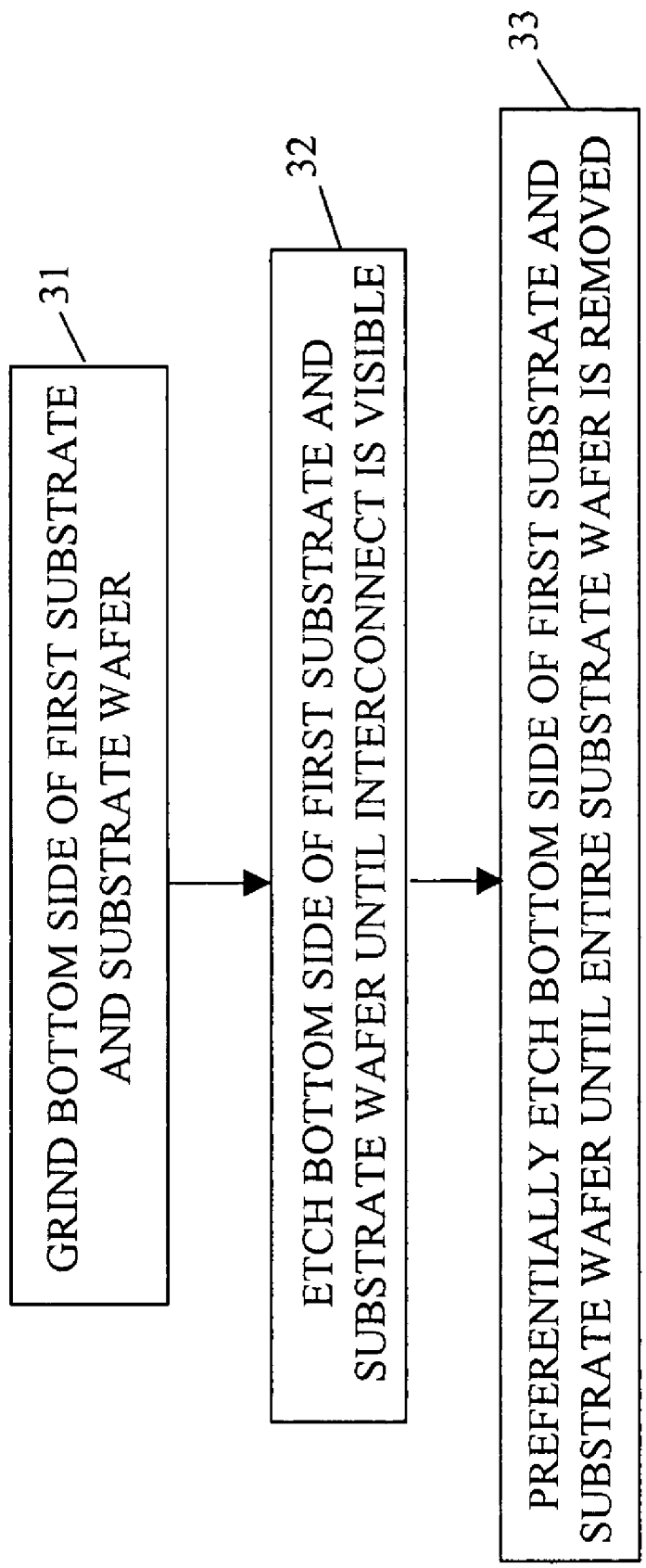
FIG. 3 is a flow chart detailing the steps of the eighth step of FIG. 1.

FIG. 3 is a list of steps to thin the bottom side of the first substrate and the substrate wafer according to the eighth step 8 of the method of FIG. 1. The first step of the thinning method 31 is grinding the bottom side of the first substrate and the substrate wafer of the integrated circuit. The grinding process is performed until only a thin layer of the substrate wafer remains, preferably leaving the integrated circuit having a height of approximately 75 um. Because of the destructive nature of the grinding process, grinding is halted prior to exposure of the interconnects or other electronic components of the integrated circuit to prevent damage to the integrated circuit and allow accurate analysis after processing.

The second step 32 of the thinning method is etching the bottom side of the first substrate and the substrate wafer until the at least one interconnect is visible. Etching consists of removing the substrate wafer through application of a chemical. With wet etching, a liquid is applied to the substrate wafer and the substrate wafer is dissolved. With dry etching, the substrate wafer is converted into a gaseous compound through the application of a chemical or physical process. In the preferred embodiment, the substrate wafer and first substrate are wet etched until the components of the integrated circuit appear through the substrate wafer. The thickness of the first substrate and integrated circuit at this point is preferably approximately 10 um. The etching process is stopped when the interconnects of the integrated circuit are partially visible.

The third step 33 of the thinning method is preferentially etching the bottom side of the first substrate and the substrate wafer until the entire substrate wafer is removed. The substrate wafer is preferably removed using a selective etch process. The selective etch process preferably comprises immersing the first substrate and substrate wafer in a chemical that selectively etches the material that composes the first substrate and substrate wafer until the entire substrate wafer is removed from the integrated circuit. As would be obvious to one of skill in the art, the specific chemical used for this selective etch will depend on the material used for the first substrate and the substrate wafer. Methods of performing a selective etch, and chemicals used for the process, are well known to those of skill in the art, and any appropriate methods and chemicals may be used in conjunction with the present invention. After removal of the substrate wafer, the first substrate and integrated circuit preferably have a thickness of approximately 2.5 um. After removal of the entire substrate wafer, the components of the integrated circuit are visible when viewing the first substrate from the bottom side.

The ninth step 9 of the method of FIG. 1 is performing an analytical imaging technique on the integrated circuit. Analytical imaging of the integrated circuit will preferably be performed by imaging the components of the integrated circuit from the bottom side of the first substrate. This is possible because the components of the integrated circuit are visible from the bottom side of the first substrate after complete removal of the substrate wafer, as was explained in greater detail above. Many analytical imaging techniques exist, as is obvious to those of skill in the art, and any conventional method may be used in conjunction with this invention. An advantage of the present invention is that, since the components are directly exposed after removal of the substrate wafer, one analytical imaging technique that may be used is conventional optical imaging using an optical microscope. Any additional suitable imaging technique, including scanning electron microscopy and photon emission microscopy, may also be used, as would be obvious to one of skill in the art.

The invention claimed is:
1. A method of surface preparation and imaging of integrated circuits, comprising the steps of:
   a) selecting a first substrate having a top side and a bottom side and a thickness;
   b) cutting an opening in the first substrate, wherein the opening matches the size of an integrated circuit to be analyzed, and wherein the integrated circuit includes a substrate wafer, at least one interconnect, and at least one electronic device;
   c) selecting a second substrate having a top side and a bottom side and a thickness;
   d) applying an adhesive film having a bottom side and a top side to the top side of the first substrate, the adhesive film covering the opening in the first substrate, and further having adhesive on both the bottom side and the top side;
   e) inserting the integrated circuit into the opening in the first substrate such that the substrate wafer of the integrated circuit and the bottom side of the first substrate are on the same plane;
   f) attaching the integrated circuit to the bottom side of the adhesive film;
   g) bonding the first substrate and the integrated circuit to the second substrate;
   h) thinning the bottom side of the first substrate and the integrated circuit such that the substrate wafer of the integrated circuit is removed; and
   i) performing an analytical imaging technique on the integrated circuit.

2. The method of claim 1, wherein the step of thinning the second substrate and integrated circuit further comprises the steps of:
   a) grinding the bottom, side of the first substrate and the substrate wafer of the integrated circuit;
   b) etching the bottom side of the first substrate and the substrate wafer until the at least one interconnect is visible; and
   c) preferentially etching the bottom side of the first substrate and the substrate wafer until the entire substrate wafer is removed.

3. The method of claim 2, wherein the step of bonding the first substrate, the second substrate and the integrated circuit further comprises the steps of:
   a) placing the second substrate in contact with top side of the adhesive film;
   b) applying pressure to first substrate, the second substrate and the integrated circuit such that the first substrate, the second substrate and the integrated circuit are pressed in the direction of the adhesive film; and
   c) applying heat to the first substrate and the second substrate.

4. The method of claim 3, wherein the step of cutting an opening in the first substrate comprises cutting an opening in the first substrate, wherein the opening matches the size of an integrated circuit to be analyzed, and wherein the integrated circuit includes a substrate wafer, at least one interconnect, and at least one electronic device, and wherein the height of the integrated circuit is equal to the thickness of the first substrate.

5. The method of claim 4, wherein the step of selecting a second substrate comprises selecting a second substrate having a top side and a bottom side and a thickness, wherein the thickness of the second substrate is equal to the thickness of the first substrate.

6. The method of claim 5, wherein the step of selecting a second substrate comprises selecting a second substrate having a top side and a bottom side and a thickness, wherein the thickness of the second substrate is equal to the thickness of the first substrate and wherein the second substrate is composed of the same material as the first substrate.

7. The method of claim 6, wherein the step of selecting a first substrate comprises selecting a first substrate having a top side and a bottom side and a thickness, wherein the first substrate is comprised of a material selected from the group of materials consisting of silicon, quartz, porous polysilicon, silicon on insulator, gallium arsenide and any other suitable material.

8. The method of claim 7, wherein the step of performing an analytical imaging technique on the integrated circuit comprises performing an analytical imaging technique on the integrated circuit using a method chosen from the group of methods including optical microscopy, scanning electron microscopy, photon emission microscopy, and any other suitable method.

9. The method of claim 8, wherein the step of cutting an opening in the first substrate comprises cutting an opening in the first substrate comprises cutting an opening in the first substrate, wherein the opening matches the size of an integrated circuit to be analyzed, and wherein the integrated circuit includes a substrate wafer, at least one interconnect, and at least one electronic device, and wherein the height of the integrated circuit is equal to the thickness of the first substrate and the substrate wafer is composed of the same material as the first substrate.

10. The method of claim 1, wherein the step of bonding the first substrate, the second substrate and the integrated circuit further comprises the steps of:
   a) placing the second substrate in contact with top side of the adhesive film;
   b) applying pressure to first substrate, the second substrate and the integrated circuit such that the first substrate, the second substrate and the integrated circuit are pressed in the direction of the adhesive film; and
   c) applying heat to the first substrate and the second substrate.

11. The method of claim 1, wherein the step of cutting an opening in the first substrate comprises cutting an opening in the first substrate, wherein the opening matches the size of an integrated circuit to be analyzed, and wherein the integrated circuit includes a substrate wafer, at least one interconnect, and at least one electronic device, and wherein the height of the integrated circuit is equal to the thickness of the first substrate.

12. The method of claim 1, wherein the step of selecting a second substrate comprises selecting a second substrate having a top side and a bottom side and a thickness, wherein the thickness of the second substrate is equal to the thickness of the first substrate.

13. The method of claim 1, wherein the step of selecting a second substrate comprises selecting a second substrate having a top side and a bottom side and a thickness, wherein the thickness of the second substrate is equal to the thickness of the first substrate and wherein the second substrate is composed of the same material as the first substrate.

14. The method of claim 1, wherein the step of selecting a first substrate comprises selecting a first substrate having a top side and a bottom side and a thickness, wherein the first substrate is comprised of a material selected from the group of materials consisting of silicon, quartz, porous polysilicon, silicon on insulator, gallium arsenide and any other suitable material.

15. The method of claim 1, wherein the step of selecting a second substrate comprises selecting a second substrate having a top side and a bottom side and a thickness, wherein the second substrate is comprised of a material selected from the group of materials consisting of silicon, quartz, porous polysilicon, silicon on insulator, gallium arsenide and any other suitable material.

16. The method of claim 1, wherein the step of performing an analytical imaging technique on the integrated circuit comprises performing an analytical imaging technique on the integrated circuit using a method chosen from the group of methods including optical microscopy, scanning electron microscopy, photon emission microscopy, and any other suitable method.

17. The method of claim 1, wherein the step of cutting an opening in the first substrate comprises cutting an opening in the first substrate, wherein the opening matches the size of an integrated circuit to be analyzed, and wherein the integrated circuit includes a substrate wafer, at least one interconnect, and at least one electronic device, wherein the substrate wafer is composed of the same material as the first substrate.

* * * * *